United States Patent [19]

Dravkin

[11] Patent Number: 4,812,770
[45] Date of Patent: Mar. 14, 1989

[54] SATURABLE REACTOR CURRENT PULSE GENERATOR

[75] Inventor: David Dravkin, Rehovot, Israel

[73] Assignee: Israel Aircraft Industries Ltd., Lod, Israel

[21] Appl. No.: 48,798

[22] Filed: May 12, 1987

[30] Foreign Application Priority Data

May 16, 1986 [IL] Israel .......................... 78810

[51] Int. Cl.$^4$ ........................ H03K 3/30; H03K 3/45
[52] U.S. Cl. ........................... 328/67; 307/282; 307/246; 307/314
[58] Field of Search ............... 307/273, 275, 282, 314, 307/246; 328/67

[56] References Cited

U.S. PATENT DOCUMENTS 2,904,684  9/1959  Begeman ............................... 328/67
4,058,743  11/1977  Armstrong ........................... 307/282
4,698,518  10/1987  Pacals ................................... 328/67

FOREIGN PATENT DOCUMENTS 0703899  12/1979  U.S.S.R. ............................ 307/314

Primary Examiner—Stanley D. Miller
Assistant Examiner—Timothy P. Callahan
Attorney, Agent, or Firm—Marshall, O'Toole, Gerstein, Murray & Bicknell

[57] ABSTRACT

Method and apparatus for generating a current pulse of substantially constant amplitude and variable pulse width. A first energy source applied through a saturable device (e.g., a saturable reactor with a square loop operating characteristic) to an energy storage device (e.g., an inductor) maintains an initial energy storage level in the storage means and at the same time keeps the saturable device in a saturated condition. The application of a voltage pulse from a second power source to the energy storage device causes additional energy to accumulate in the storage device, which additional energy appears as an output current pulse in a connected load when the applied voltage pulse ends. The duration of the output pulse, which is essentially constant in amplitude, is controlled by the duration of the volatage pulse from second power source.

19 Claims, 2 Drawing Sheets

SATURABLE REACTOR CURRENT PULSE GENERATOR

FIELD OF THE INVENTION

The present invention is related to pulse modulators, more particularly, to pulse modulators which generate current pulses.

BACKGROUND OF THE INVENTION

There are known pulse modulator systems which use energy storage devices as part of a pulse forming network (PFN) to store energy during a charging cycle, with the stored energy being released during a discharge cycle and dissipated in a load through use of a switching arrangement.

A known pulse modulator used for obtaining high voltage square pulses such as are used in radar transmitters is a line type pulser, or "soft tube modulator". In these systems, the PFN consists of a series of lumped capacitances and impedances, with the dominant effect being that of a capacitance during the charging cycle. All of the energy stored in the PFN is dissipated when the PFN is dumped into the load on closing of the pulser electronic switch, such as a thyratron or SCR. The problems with this type of pulse modulator are that it is impossible to change the pulse width from pulse to pulse, it is necessary to use a high voltage power supply, and impedance matching of the load is required in many cases.

In pulse modulator systems where an inductor is the energy storage device employed in the PFN, storage and dissipation of the energy in the inductor is determined by the corresponding exponential rise and decay of the current flowing therein. The time constant of the circuit determines the pulse width during which all of the stored energy is dissipated. Since the time constant does not change, if a shorter charging time is used, the necessary result is a limitation of the amplitude of the current available to the load. In some applications this may become a problem, as it is impossible to maintain a constant pulse amplitude.

For example, in the case of a car ignition system where an induction coil is used for storage of energy, increased PRF is the result of increased engine rpm. The undesired effect is that the amount of stored energy available for the spark is decreased, and this may adversely affect performance as the spark gap becomes fouled and greater pulse amplitudes are required to ensure spark generation.

Another type of pulse modulator used for obtaining high voltage square pulses is a "hard tube modulator". In this type of modulator, a large capacitor in which energy has been stored is partially discharged by a high voltage vacuum switch (pulse triode) into the load. In this modulator, it is possible to vary the pulse width, but because of the large capacitance required, the weight is considerably increased. In addition, due to the high impedance of the vacuum switch, a low efficiency is achieved.

It would therefore be desirable to provide a current pulse generator where the pulse width is variable from pulse to pulse and a high PRF can be achieved with high efficiency and little or no change in the output amplitude, without the requirement of a high voltage power supply or for impedance matching.

SUMMARY OF THE INVENTION

It is accordingly a principal object of the present invention to overcome the above-mentioned disadvantages and provide a current pulse generator which is efficient and is capable of a high PRF without changing the substantially constant amplitude, while allowing a variable pulse width of the generated current pulses.

According to the invention there is provided a current pulse generator capable during a charging period to receive power from an external power supply and operable to deliver a substantially constant current pulse of variable width to a connected load during a discharging period, the generator comprising:

a source for providing initial energy;

energy storage apparatus;

a saturable device operatively associated with the source and the energy storage apparatus to direct the initial energy for storage in the energy storage apparatus while in a saturation state prior to the charging period; and a switch operable to determine the duration of the charging period by connecting the external power supply to the generator, such that for the duration the charging period the saturable device leaves the saturation state and additional energy accumulates in the energy storage apparatus above the level of the initial stored energy, the additional energy producing a current pulse upon dissipation in the load during the discharging period commencing at the end of the charging period, the saturable device automatically reentering the saturation state at the moment the additional energy dissipation ceases, the current pulse being repeatable with varying pulse width in accordance with the operation of the switch.

A feature of the invention is the use of an inductor as the energy storage apparatus which is maintained with an initial nonzero amount of energy at all times. The external power source adds to the initial energy by accumulation of additional stored energy during the charging period in a controlled fashion, with this additional energy being released for dissipation in the load immediately thereafter in a discharging period.

In one embodiment of the invention, a saturable reactor is used as the saturable device for automatically directing a biasing current through the inductor and maintaining the initial energy stored therein between current pulses. The saturable reactor acts as a fast automatic switch which connects the source to the inductor when the additional energy dissipation ceases.

Another feature of the invention is the use of a low power supply as the source which provides the initial energy level and polarizes the saturable reactor.

Another feature of the invention is the use of an electronic switching device as the switch which is responsive to a control pulse for establishing the length of the charging period.

In another embodiment of the invention, a saturable transformer is used instead of the saturable reactor.

In still another embodiment of the invention, a saturable autotransformer is used instead of the saturable reactor.

The current pulse generator of the present invention is suitable for a wide variety of application such as in radar transmitters, navigation systems and medical systems such as a pacemaker where a high resolution of time intervals is required. Other applications include precision spot welding where a particular amount of energy is to be quickly dissipated, or applications where a high voltage output is required.

BRIEF DESCRIPTION OF THE DRAWINGS

For a better understanding of the invention with regard to the embodiments thereof, reference is made to the accompanying drawings, in which.

DETAILED DESCRIPTION OF A PREFERRED EMBODIMENT

Figure 1:
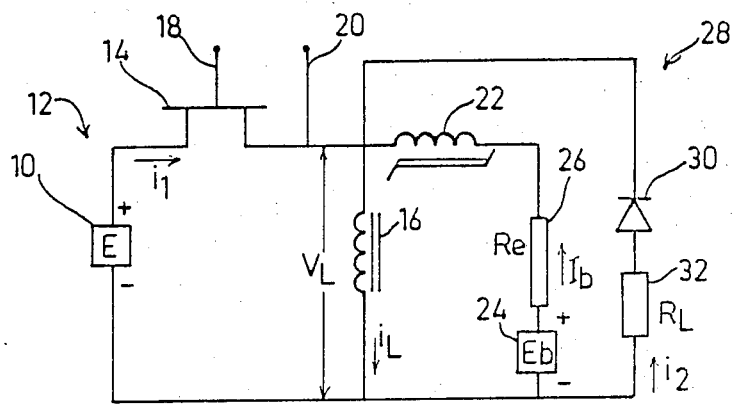
FIG. 1 shows a circuit diagram of a preferred embodiment of the current pulse generator in accordance with the present invention.

Referring now to FIG. 1, there is shown a circuit diagram of a preferred embodiment of the current pulse generator of the present invention. The circuit includes conventional, generally available electronic components which are connected in a novel arrangement and operated in a novel fashion as further described herein.

A voltage source 10 having the polarity shown forms the input to a charging loop 12 comprising an electronic switch 14 and a linear inductor 16 in series arrangement. The electronic switch 14 is a fast acting device such as an FET (field-effect transistor) which can be controlled by a control pulse which is input between its gate and source leads 18 and 20. The electronic switch 14 can also be a triode vacuum tube suitably connected. The inductor 16 is a standard ferromagnetic core device and has inductance L, and is connected so as to complete the charging loop 12 at voltage source 10.

Connected in parallel with the inductor 16 are two individual circuit branches, each containing components designed to operate with the charging network 12 during different stages of the current pulse generator operation. The first of these branches contains a saturable reactor 22 in series with a low voltage source 24 having the polarity shown.

The low voltage source 24 is used for creating an initial non-zero energy level in the inductor 16 while establishing the saturation state of the saturable reactor 22. A bias current Ib is provided through a resistor 26 representing an equivalent resistance Re which includes the resistance of the inductor 16 and saturable reactor 22. The voltage Eb available from the low voltage source 24 is very much less than the voltage E of the voltage source 10. [The saturable reactor 22 is of a known type having a core of magnetic material with a very high permeability which exhibits a square loop operating characteristic.]

The second of the circuit branches in parallel with inductor 16 is a discharging loop 28 containing a diode 30 and load impedance 32 in series arrangement. The load impedance 32 is that resistance exhibited by a useful load, such as a magnetron, an INPATT diode, or other transmitting device. The diode 30 is a conventional solid-state or vacuum tube type, and the load impedance 32 has a resistance RL through which the generated current pulses i2 flow during a portion of the current pulse generator operation, as further described herein.

In one embodiment, the components of the circuit diagram of FIG. 1 are chosen with the following characteristics: for the voltage source 10, E=25 volts; electronic switch 14 is an FET type 2N6760; inductor 16 is a core type T5026B with thirty turns; saturable reactor 22 is a core type 3T9120D500AA with six turns; low voltage source 24 has Eb=1 volt; resistor 26 has equivalent resistance Re=0.25 ohm; diode 30 is a type 1N5823; and the load 32 has resistance RL=25 ohm.

In use, the current pulse generator operates in two stages: the first is an accumulation of energy during a charging period in which the inductor 16 acts as an energy storage device, and the second is the generation of the current pulse in the load 32 during a discharging period in which the inductor 16 acts as a current source. The saturable reactor 22 provides the function of a fast automatic switch maintaining the initial energy level of the energy storage device at the beginning and end of the two stage operation, while the electronic switch 14 permits control of the first stage of operation.

In the initial current pulse generator operation, there is no current flowing in the charging loop 12 because the electronic switch 14 is turned off, no control pulse Vg having yet been applied between its gate and source leads 18 and 20. However, the low voltage source 24 provides bias current Ib to the inductor 16 current iL, initially equivalent to:

$$iL = Ib = Eb/Re \quad (1)$$

The magnetic core of the saturable reactor 22 is initially set so that it is driven into the negative saturation state by the bias current Ib, such that its induction is at a value $-Bs$. As is well known from the operating characteristics of a saturable reactor, a low impedance to current passage is presented when it is in the saturation state, either negative or positive. Thus, the bias current Ib develops a small positive voltage across the active resistance of the inductor 16 and diode 30 is reverse biased so that no current flows in the load 32 and i2=0.

As stated, the bias current Ib flowing through the saturable reactor 22 is the initial inductor 16 current iL and this establishes an initial non-zero energy storage level in the inductor represented as:

$$Wi = 0.5L(Ib)^2 \quad (2)$$

The first stage of operation is now initiated by application of a control pulse Vg between the gate and source leads 18 and 20 of the electronic switch 14, causing the switch 14 to conduct and thereby connect the voltage source 10 across the inductor 16 and across the two circuit branches connected in parallel therewith, respectively containing the saturable reactor 22 and the load 32. There is a negligible voltage drop in the switch 14, so that effectively all of voltage E is applied to the inductor 16 and VL=E. The saturable reactor 22 is also impressed with voltage E which is much greater than voltage Eb. The diode 30 remains reverse biased so that current i2 remains zero.

When the control pulse Vg is initiated, the saturable reactor 22 acts as a fast automatic switch and responds to the voltage E impressed across it by quickly going out of the negative saturation state $-Bs$. In doing so, the operating characteristic of the saturable reactor 22 dictates that it become a high impedance to current, virtually disconnecting the low voltage source 24 from the inductor 16. All the while that the control pulse Vg remains between the gate and source leads 18 and 20 of the switch 14, the voltage E changes the induction Bsr of the saturable reactor 22 core in accordance with the relation:

$$Bsr = -Bs + 1/NA \, E dt \tag{3}$$

where A is the net cross-section of the reactor 22 core and N is the number of turns in its winding. In the preferred embodiment, the saturable reactor 22 core is designed with values of A and N such that the core never reaches positive saturation in accordance with equation (3). This also means that the duration of the control pulse Vg is less than that required for reaching positive saturation.

Figure 2:
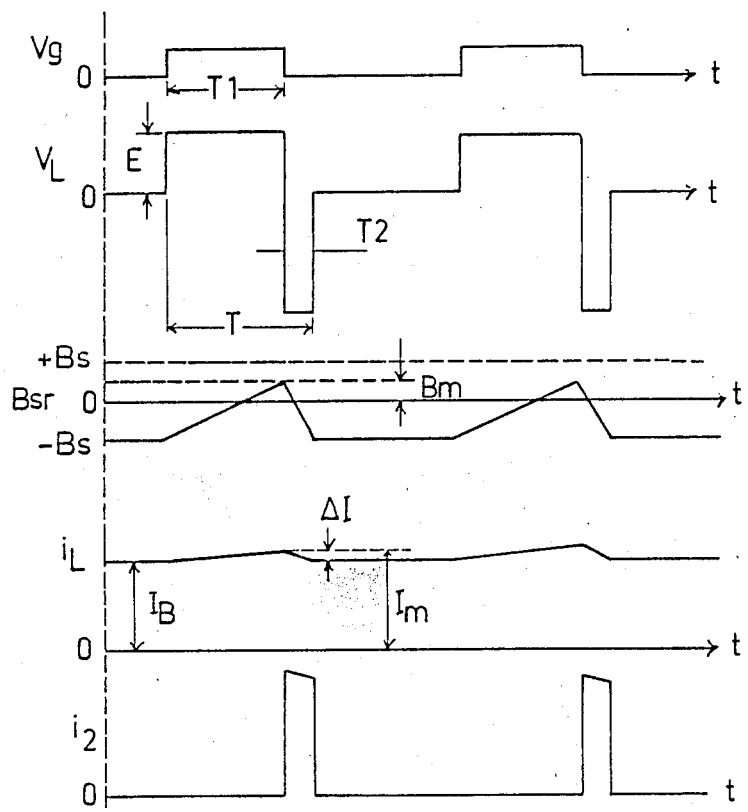
FIG. 2 shows a set of performance waveforms describing the operation of the circuit of FIG. 1.

Referring now to FIG. 2, there is shown a set of performance waveforms describing the time operation of the circuit of FIG. 1. The top waveform indicates that during continuous application of the control pulse Vg to the switch 14 there is defined a changing period T1. The second waveform indicates that the voltage VL is equal to the voltage E of voltage source 10 during charging period T1. The third waveform describes the variation in the induction Bsr which begins in the negative saturation state -Bs because of bias current Ib before charging period T1 and moves toward the positive saturation state during T1 in accordance with equation (3).

During charging period T1, the voltage source 10 supplies current i1 to the inductor 16. Since the inductor 16 current iL was initially Ib before the charging period as given in equation (1), it cannot change instantaneously with the closing of switch 14 and i1 therefore starts with the value Ib. During T1, the flow of current i1 to the inductor 16 increases as shown in the fourth waveform according to:

$$i1 = iL = Ib \, 30 \, 1/L \, E dt \tag{4}$$

At the end of the charging period when time T1 has elapsed and the control pulse Vg is removed from switch 14, the induction Bsr has reached a value of:

$$Bm = -Bs + 1/NA \, E dt \tag{5}$$

At this same instant, the magnitude of the inductor 16 current iL has built up to the value of:

$$Im = Ib + 1/L \, E dt \tag{6}$$

The inductor 16 has accumulated energy during the time the inductor 16 current iL has been increasing, and the accumulated energy is in addition to the initial energy already stored in the inductor 16 as given in equation (2). The additional energy accumulated during T1 is expressed as:

$$Wi(T1) = 0.5L[(Ib+I)^2 - Ib^2] \tag{7}$$

where $I = Im - Ib$.

When the control pulse Vg is removed from switch 14 so that it no longer conducts, the charging period T1 ends and the second stage of operation commences in the discharging period T2 during which the current pulse is generated. As the charging period T2 ended with the inductor 16 current iL at the level of Im per equation (6), the discharging period T2 begins with the instantaneous appearance of a reverse inductive voltage across the inductor 16 with an initial magnitude necessary to maintain this current level and direction of flow. This reverse inductive voltage is shown in the second waveform of FIG. 2 as the VL having opposite polarity during discharging period T2 from that existing during period T1.

Since the diode 30 is now forward biased by voltage VL and the saturable reactor 22 still has a high impedance maintaining the inductor 16 as disconnected from the low voltage source 24, the inductor 16 current iL now flows through the load 32 as output current i2 shown in the fifth waveform in Fig. 2. Neglecting the forward voltage drop on diode 30, this current i2 develops a voltage magnitude in the load 32 equivalent to that of the inductor 16:

$$VL = V2 = (i2)(RL) \tag{8}$$

During the discharging period T2, the inductor 16 current iL and the output current i2 decrease in accordance with:

$$iL = i2 = Im - 1/L \, VL \, dt \tag{9}$$

At the same time, the induction Bsr of the saturable reactor 22 decreases towards the negative saturation state as follows:

$$Bsr = Bm - 1/NA \, VL \, dt \tag{10}$$

At the same moment after T2 has elapsed (when t=T) and the inductor 16 current iL returns to its initial value Ib, the induction Bsr of the saturable reactor 22 returns to the negative saturation state −Bs. This causes the impedance of the saturable reactor 22 to fall quickly to a very low value so that it acts almost like a short circuit and quickly cuts off the output current i2 by reverse biasing diode 30 with the voltage Eb of low voltage source 24. The current Ib once again flows from the low voltage source 24 and the system is returned to its initial state so that a new control pulse Vg can be applied to switch 14 to begin the operation again.

The output current i2 exists as a pulse for the duration of the discharging period T2 (T1+T2=T) which duration is dependent on the impedance of the load 32. For a pure resistance, this period is equivalent to:

$$T2 = (L/RL)\ln[(Ib+I)] \tag{11}$$

Since the inductor 16 current iL returns to the initial value Ib which was present before the first stage of operation, the additional energy which was accumulated by the inductor 16 in the charging period T1 matches that dissipated in the load 32 during the discharging period T2. The initial non-zero energy storage level in inductor 16 given by equation (2) is maintained, because the saturable reactor 22 acts as a fast automatic switch to reconnect the low voltage source 24 to the inductor 16 when the additional energy dissipation ceases. The diode 30 prevents absorption by the load 32 of the energy being accumulated by the inductor during T1, but the diode 30 may not be required where the load is capable only of unidirectional current flow.

The current pulse i2 generated in accordance with the operation above-described is subject to droop as the inductor 16 discharges during T2 as indicated in equation (9). This effect can be minimized by choice of the inductor 16 with a sufficiently large value of inductance L. The result is a nearly square output current pulse i2, which in the limit approaches Ib since I is also minimized and iL does not increase substantially over its initial value as seen from equation (6). Thus, it can be seen that the magnitude of the output current pulse i2 and the input current i1 are nearly equivalent to Ib and are thus independent of the impedance of the load 32 and do not depend on the magnitude of the voltage source 10.

An important relationship can now be established for the input and ouput voltages and the charging period T1 and pulse duration T2 over one complete cycle of the generator during time T=T1+T2. Since for all types of inductors the volt second integral taken for the full period of operation is zero, it follows that:

$$VL\ dt = Edt + V2\ dt = 0$$

or $$Edt = -V2\ dt \qquad (12)$$

For the case of the square current pulse i2 having constant voltage V2, equation (12) reduces to:

$$E \times T1 = |V2 \times T2|$$

or $$|T2| = E \times T1/V2 \qquad (13)$$

Thus, it can be seen that the output pulse duration T2 is proportional to T1, the duration of the control pulse Vg. The output pulse is thus readily controllable.

A high pulse repetition frequency can be achieved since the generator returns to its initial state at the same moment as the output pulse ends and the control pulse can be applied almost immediately after to begin a new charging period.

Figure 3:
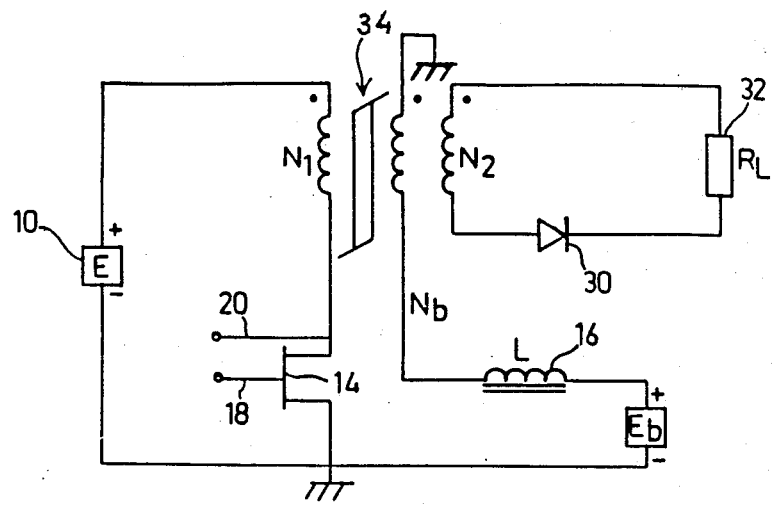
FIG. 3 shows a circuit diagram of an alternative embodiment of the invention in which a saturable transformer replaces the saturable reactor of FIG. 1.

Another alternative embodiment of the invention is shown in FIG. 3, this time using a 3-winding saturable transformer 34 in place of the saturable reactor 22 of FIG. 1. Instead of equivalent values as in FIG. 1 for the input, output and bias currents, the input current i1, output current i2 and the bias current Ib can be separately selected in this arrangement in accordance with the turns ratio of the windings N1, N2 and bias winding Nb.

The operation of this embodiment begins with initial inductor current Ib flowing through the bias winding Nb. This creates an initial energy storage level in the inductor 16 and saturates the core of the transformer 34. Since the transformer 34 is saturated, there is no induced voltage on output winding N2, and output current i2 is zero.

When the control pulse Vg is applied to the electronic switch 14 during the charging period 0-T1, the voltage E is applied to the primary winding N1 of the saturable transformer 34. This causes the saturable transformer 34 to go out of saturation, such that its winding inductance rises to a very high value and it begins to operate as a normal line transformer. The diode 30 is reverse biased by the induced voltage on winding N2, and the output current i2 remains zero.

The voltage appearing on the Nb winding during the charging period causes the inductor current iL to rise from Ib to a higher value, and this is accompanied by accumulation of additional energy in the inductor 16.

When the control pulse Vg ends, the inductor current iL must continue to flow in the same direction with the same value. This causes a reverse inductive voltage to appear on the inductor 16 such that the bias winding Nb induces a voltage on the output winding N2 which forward biases the diode 30. Thus, output current i2 begins to flow in accordance with the turns ratio between the bias winding Nb and the output winding N2.

When the inductor current iL falls to the initial value, the saturable transformer 34 returns to the saturation state, and this ends the transfer of energy from the bias winding Nb to the output winding N2 so that the output current i2 falls to zero. The inductor 16 returns to the initial energy level, and the generator is ready for the next operation.

Figure 4:
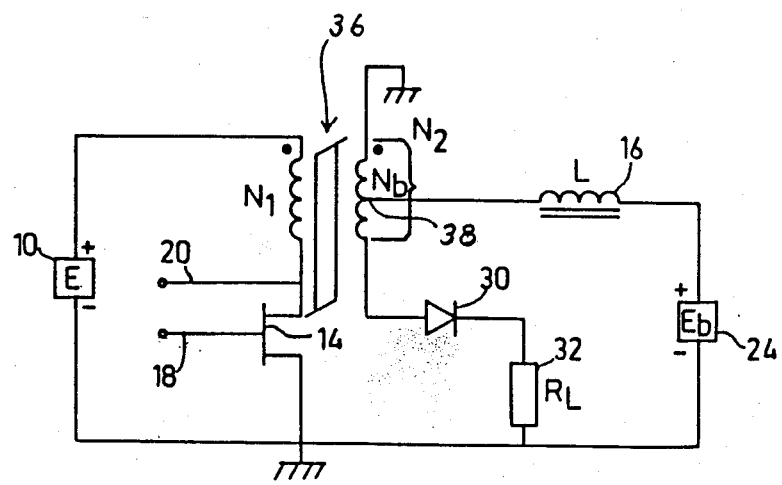
FIG. 4 shows a second alternative embodiment of the present invention in which a saturable autotransformer replaces the saturable reactor of FIG. 1.

Referring now to FIG. 4, there is shown an alternative embodiment of the invention using a two-winding saturable autotransformer 36 in place of the saturable reactor 22 of FIG. 1, with like numerals representing like components. Instead of an equivalent values as in FIG. 1 for the input, output and bias currents, this arrangement allows separate selection of these values. This can be achieved by adjustment of the position of the tap 38 on the saturable autotransformer 36 and the turns ratio between the bias winding Nb and primary winding N2. Circuit operation is self-explanatory in accordance with the known operating characteristics of the saturable transformer described in connection with FIG. 3.

Thus, in accordance with the present invention, there is provided a current pulse generator capable of a high pulse repetition frequency and variable pulse width without changing the substantially constant amplitude of the generated current pulses, eliminating the need for load impedance matching.

While the principles of the invention have been described in connection with specific apparatus and applications, it is to be understood that the description is made by way of example only and not as a limitation on the scope of the invention.

I claim:

1. A current pulse generator operable during a charging period to receive power from an external power supply and operable to deliver a substantially constant current pulse of variable width to a connected load during a discharging period, said generator comprising:
   a source means for providing initial energy;
   an energy storage means;
   a saturable device means operatively associated with said source means and said energy storage means to direct said initial energy for storage in said energy storage means, said saturable device being in a saturation state prior to said charging period; and
   a switch means connecting said external power supply to said generator, said switch being operable to control the duration of said charging period,
   such that for the duration of said charging period said saturable device means leaves said saturation state and additional energy from said external power supply accumulates in said energy storage means above the level of said initial stored energy,
   said additional energy producing a current pulse upon dissipation in the load during said discharging period commencing at the end of said charging period, said saturable device means automatically reentering said saturation state at the moment said additional energy dissipation ceases, said current pulse being repeatable with varying pulse width in accordance with the operation of said switch means.

2. The generator of claim 1 wherein said energy storage means comprises an inductor.

3. The generator of claim 1 wherein said saturable device means is a saturable reactor having a square loop magnetic core.

4. The generator of claim 2 wherein said saturable device means is a saturable reactor having a square loop magnetic core.

5. The generator of claim 4 wherein said source means is a low power supply for providing a biasing current which stores initial energy in said inductor and polarizes said saturable reactor.

6. The generator of claim 1 wherein said switch means is an electronic switch operable by a control pulse.

7. The generator of claim 2 wherein said switch means is an electronic switch operable by a control pulse.

8. The generator of claim 6 wherein said electronic switch is a field-effect transistor.

9. The generator of claim 6 wherein said electronic switch is a triode vacuum tube with a control grid.

10. The generator of claim 1 wherein said saturable device means is a saturable transformer.

11. The generator of claim 2 wherein said saturable device means is a saturable transformer.

12. The generator of claim 1 wherein said saturable device means is a saturable autotransformer.

13. In a current pulse generator powered by an external power supply, a method of repeatedly delivering current pulses to a connected load, said method comprising the steps of:

storing energy in an energy storage means at an initial non-zero energy level provided by a source, determining a charging period during which the power supply transfers additional energy to said energy storage means which is accumulated therein above said initial non-zero energy level, and determining the end of said charging period such that a discharging period commences during which said additional energy produces a current pulse upon dissipation in the load, said initial non-zero energy level being automatically reestablished in said energy storage means at the moment said additional energy dissipation ceases, said charging and discharging periods being successively repeatable in accordance with the alternate performance of said determining steps.

14. The method of claim 13 wherein said energy storage means is an inductor.

15. The method of claim 14 wherein said energy storing step comprises initially connecting said source to said inductor through a saturable reactor such that said initial non-zero energy level is achieved in said inductor and the saturation state of the saturable reactor is achieved.

16. The method of claim 14 wherein said energy storing step comprises initially connecting said source to said inductor through a saturable reactor such that said initial non-zero energy level is achieved in said inductor and the saturation state of the saturable reactor is achieved.

17. The method of claim 14 wherein the step of determining said charging period comprises application of a control pulse to an electronic switch for connecting said power supply and said inductor.

18. The method of claim 15 wherein the step of determining said charging period comprises application of a control pulse to an electronic switch for connecting said power supply and said inductor.

19. The method of claim 15 wherein said saturable reactor automatically provides substantial disconnection between the source and inductor upon the application of said control pulse, and reconnection upon the end of said discharging period.

* * * * *